(12) United States Patent
Kim et al.

(10) Patent No.: US 9,858,982 B1
(45) Date of Patent: Jan. 2, 2018

(54) REFRESH CONTROL DEVICE

(71) Applicant: SK hynix Inc., Icheon-si, Gyeonggi-do (KR)

(72) Inventors: Jin Wook Kim, Yongin-si (KR); Seon Ho Kim, Yongin-si (KR); Yin Jae Lee, Icheon-si (KR); Min Seok Choi, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/491,326

(22) Filed: Apr. 19, 2017

(30) Foreign Application Priority Data

Oct. 27, 2016 (KR) .......................... 10-2016-0141336

(51) Int. Cl.
*G11C 11/40* (2006.01)
*G11C 11/406* (2006.01)
*G11C 11/408* (2006.01)

(52) U.S. Cl.
CPC ...... *G11C 11/40626* (2013.01); *G11C 11/406* (2013.01); *G11C 11/408* (2013.01)

(58) Field of Classification Search
CPC ............ G11C 11/406; G11C 11/40615; G11C 11/40618; G11C 11/40622; G11C 11/408; G11C 11/4087; G11C 8/12; G11C 8/18

USPC .................. 365/222, 185.25, 230.06, 230.08
See application file for complete search history.

(56) References Cited

U.S. PATENT DOCUMENTS

| | | | | |
|---|---|---|---|---|
| 5,634,105 A | * | 5/1997 | Mizuno | G11C 7/22 365/230.02 |
| 6,151,244 A | * | 11/2000 | Fujino | G11C 11/401 365/149 |
| 9,171,605 B1 | * | 10/2015 | Kim | G11C 11/406 |
| 2013/0117617 A1 | * | 5/2013 | Oh | G11C 29/10 714/718 |
| 2014/0156923 A1 | | 6/2014 | Bains et al. | |

FOREIGN PATENT DOCUMENTS

KR     1020150058366 A1     5/2015

* cited by examiner

*Primary Examiner* — Tan T. Nguyen
(74) *Attorney, Agent, or Firm* — William Park & Associates Ltd.

(57) ABSTRACT

A refresh control device may include, an address processing circuit configured to divide an input address into a plurality of partial addresses, and generate an updated partial address input count based on an input count for each partial address value. The refresh control device also includes a target refresh address generation circuit configured to generate a target refresh address based on the updated partial address input count, and a target refresh circuit configured to perform a refresh operation on a word line corresponding to the target refresh address.

17 Claims, 12 Drawing Sheets

| TRADD4 | CLEAR_FLAG=0 |
|---|---|
| TRADD3 | CLEAR_FLAG=0 |
| TRADD2 | CLEAR_FLAG=0 |
| TRADD1 | CLEAR_FLAG=0 |
| TRADD0 | CLEAR_FLAG=1 |

REFRESH CONTROL DEVICE

CROSS-REFERENCES TO RELATED APPLICATION

The present application claims priority under 35 U.S.C. §119(a) to Korean application number 10-2016-0141336, filed on Oct. 27, 2016, in the Korean Intellectual Property Office, which is incorporated herein by reference in its entirety.

BACKGROUND

1. Technical Field

Various embodiments relate to a refresh control device capable of controlling a refresh operation for preventing degradation of memory cells.

2. Related Art

In a semiconductor device, a memory cell for storing data is implemented with a capacitor. Thus, when a specific word line is selected, a transistor coupled to the word line is turned on to output to a bit line the potential of a memory cell corresponding to the word line.

The potential of the memory cell gradually decreases with time. That is, the capacitor used as the memory cell in the semiconductor device is discharged with time. Thus, data stored in the memory cell may be lost. Therefore, in order to assure the reliability of data, the semiconductor device performs a refresh operation for recharging the memory cell at predetermined cycles.

When a specific word line is enabled or disabled, the voltage of a word line adjacent to the specific word line may rise or fall due to a coupling between the specific word line and the adjacent word line, thereby having an influence on the charge of a cell capacitor included in a cell coupled to the adjacent word line. Thus, when the specific word line toggles between an active state and an inactive state when the specific word line is enabled, the amount of charge stored in the cell capacitor included in the cell coupled to the adjacent word line may be changed which degrades the data of the adjacent memory cell.

Furthermore, electromagnetic waves which are generated while the word line toggles between the active state and the inactive state may introduce electrons into a cell capacitor of a memory cell coupled to the adjacent word line or discharge electrons from the cell capacitor, thereby damaging data stored in the cell capacitor.

The phenomenon that data of memory cells connected to the corresponding word line or adjacent word line are damaged due to a high number of active operations may be referred to as row hammering or word line disturbance.

In order to prevent row hammering, an additional refresh operation (target refresh operation) needs to be performed on a specific word line which is frequently enabled.

SUMMARY

Various embodiments are directed to a refresh control device capable of detecting a word line corresponding to the target of a target refresh operation, and performing the target refresh operation.

In an embodiment of the present disclosure, a refresh control device may include: an address processing circuit configured to divide an input address into a plurality of partial addresses, and generate an updated partial address input count based on an input count for each partial address value; a target refresh address generation circuit configured to generate a target refresh address based on the updated partial address input count; and a target refresh circuit configured to perform a refresh operation on a word line corresponding to the target refresh address.

BRIEF DESCRIPTION OF THE DRAWINGS

Features, aspects, and embodiments are described in conjunction with the attached drawings, in which.

DETAILED DESCRIPTION

Hereafter, various embodiments according to the present disclosure will be described with reference to the accompanying drawings.

Figure 1:
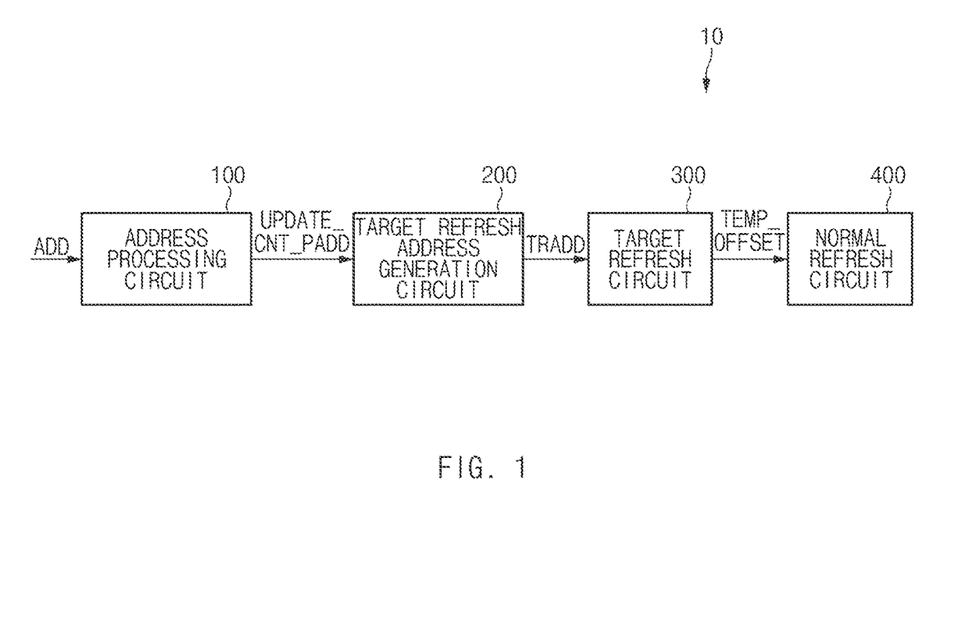
FIG. 1 is a configuration diagram of a refresh control device according to an embodiment.

FIG. 1 is a configuration diagram of a refresh control device 10 according to an embodiment.

Referring to FIG. 1, the refresh control device 10 includes an address processing circuit 100, a target refresh address generation circuit 200, a target refresh circuit 300, and a normal refresh circuit 400.

The address processing circuit 100 generates a plurality of partial addresses PADD, which will be explained later, by dividing an input address ADD. Furthermore, the address processing circuit 100 calculates input counts of partial address values of each of the partial addresses PADD, and outputs updated partial address input counts or updated input counts UPDATE_CNT_PADD for each of the partial address values. The input address ADD may include a row address indicating a word line to which an accessed target memory cell is coupled.

The target refresh address generation circuit 200 may generate a target refresh address TRADD based on the updated input counts UPDATE_CNT_PADD of the partial address values.

For example, when each specific partial address value of the plurality of partial addresses is inputted a preset number of times or more, the target refresh address generation circuit 200 may generate the target refresh address TRADD using the specific partial address values.

The target refresh circuit 300 performs a target refresh operation on the target refresh address TRADD. The target refresh circuit 300 may generate a temperature offset signal TEMP_OFFSET in response to the target refresh operation.

The normal refresh circuit 400 may perform a normal refresh operation based on the temperature offset signal TEMP_OFFSET at a predetermined cycle or cycle time. The cycle of the normal refresh operation may be changed depending on temperature. For example, when the temperature at which the normal refresh operation is performed is varied according to the temperature offset signal TEMP_OFFSET, the cycle of a normal refresh operation may be changed. Therefore, the target refresh operation may be performed to compensate for an increase in cycle of the normal refresh operation.

Figure 2:
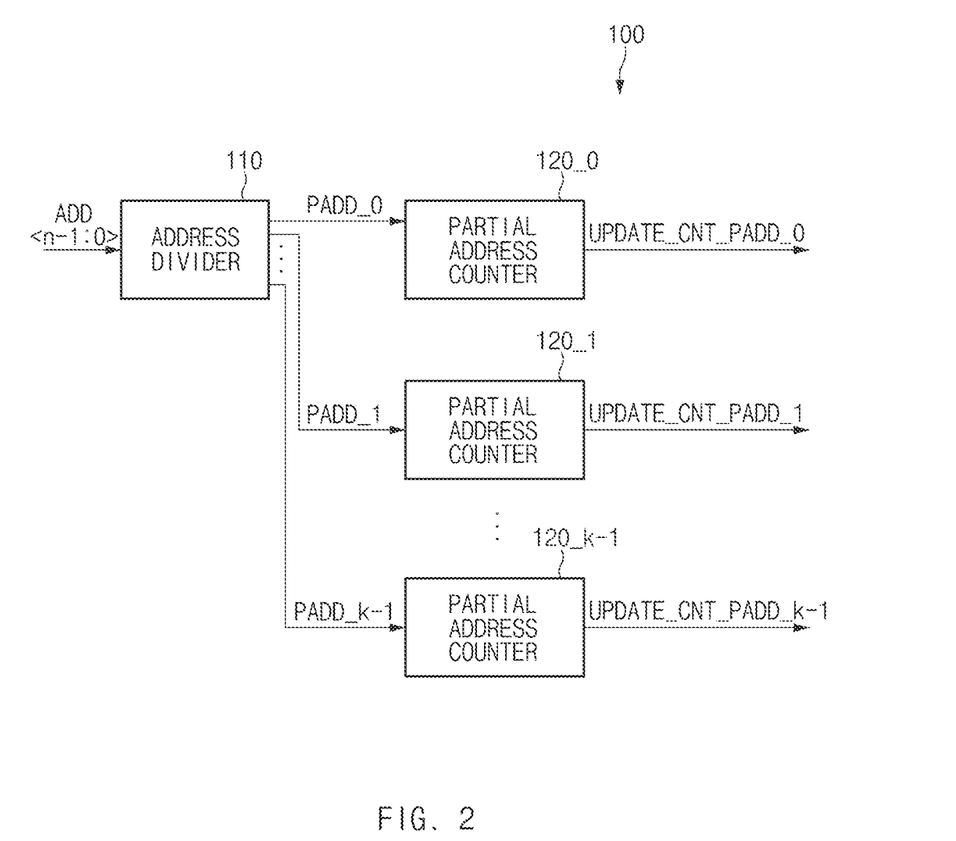
FIG. 2 is a configuration diagram of an address processing circuit according to the embodiment.

FIG. 2 is a configuration diagram of the address processing circuit 100 according to an embodiment.

Figure 4:
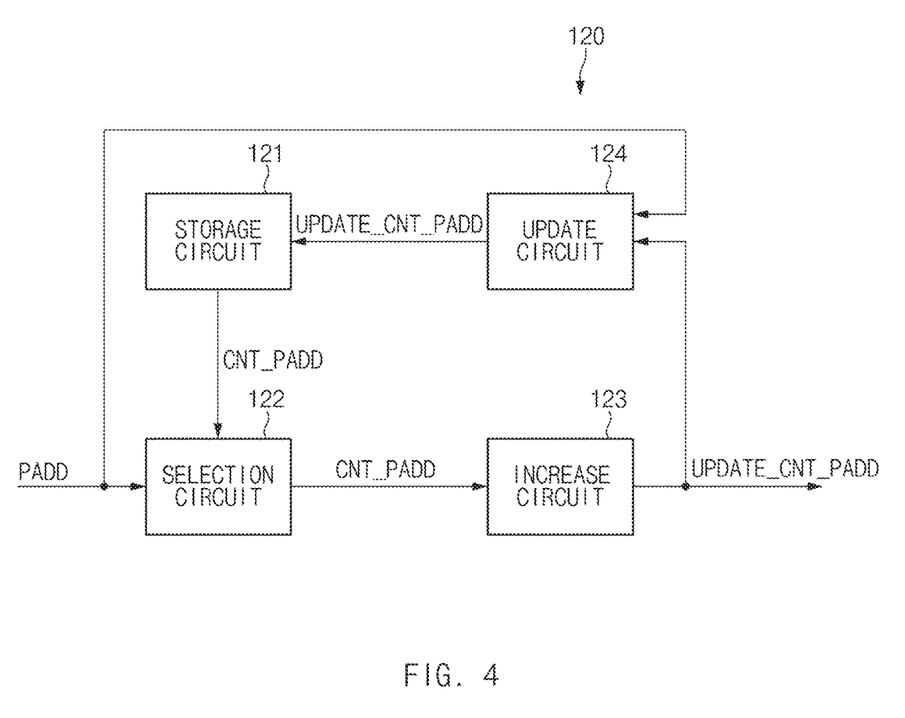
FIG. 4 is a configuration diagram of a partial address counter.

Referring to FIG. 2, the address processing circuit 100 may include an address divider 110 and a plurality of partial address counters 120_0 to 120_k-1 corresponding to the divided partial addresses PADD_0 to PADD_k-1, where k may be a natural number greater than or equal to 2, respectively. Each of the plurality of partial address counters 120_0 to 120_k-1 may be represented by 120 as illustrated in FIG. 4.

The address divider 110 may divide the input address ADD<n−1:0> having a plurality of bits into the plurality of partial addresses PADD_0 to PADD_k-1. The plurality of partial addresses PADD_0 to PADD_k-1 may be represented by PADD.

The partial address counters 120_0 to 120_k-1 count the input of the partial addresses PADD_0 to PADD_k-1 which are divided by the address divider 110. The partial address counters 120_0 to 120_k-1 count the inputs of the corresponding partial addresses PADD_0 to PADD_k-1, for respective partial address values. Each of the partial address counters 120_0 to 120_k-1 may generate the updated input counts UPDATE_CNT_PADD_0 to UPDATE_CNT_PADD_k-1 indicating an input count of the corresponding partial address values.

Figure 3A:
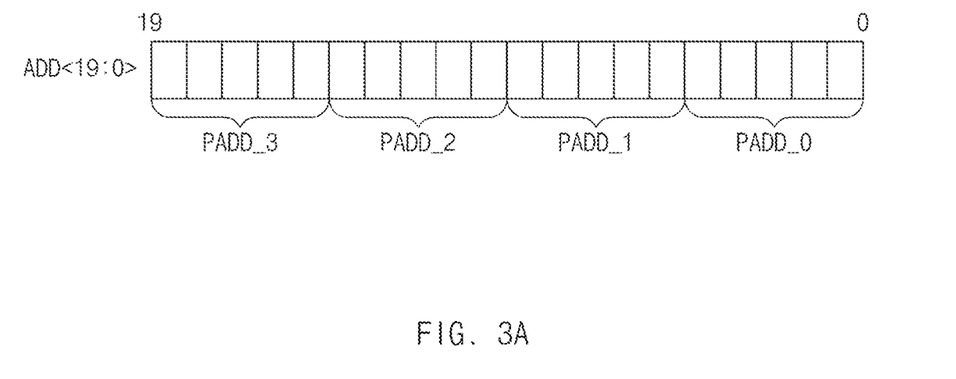
FIGS. 3A and 3B are diagrams for describing an operation of an address divider.
Figure 3B:
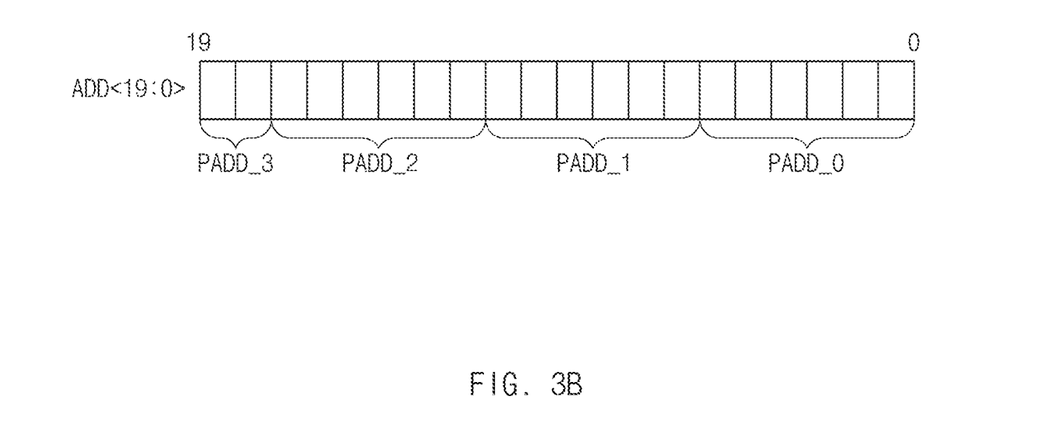

FIGS. 3A and 3B are diagrams for describing an operation of the address divider 110 which divides an input address ADD<19:0> into a plurality of partial addresses PADD_0 to PADD_3. FIGS. 3A and 3B are based on an example in which the input address ADD<19:0> contains 20 bits and is divided into four partial addresses PADD_0 to PADD_3. That is, n is set to 20, and k is set to 4.

Referring to FIG. 3A, the address divider 110 generates the partial address PADD_3 based on the input address bits ADD<19:15>, generates the partial address PADD_2 based on the input address bits ADD<14:10>, generates the partial address PADD_1 based on the input address bits ADD<9:5>, and generates the partial address PADD_0 based on the input address bits ADD<4:0>.

In FIG. 3A, all of the partial addresses PADD_0 to PADD_3 have a length of five bits. That is, the lengths of the partial addresses PADD_0 to PADD_3 may be set to the same value. The length may be referred to as a 'number of bits'.

Referring to FIG. 3B, alternatively the address divider 110 generates the partial address PADD_3 based on the input address bits ADD<19:18>, generates the partial address PADD_2 based on the input address bits ADD<17:12>, generates the partial address PADD_1 based on the input address bits ADD<11:6>, and generates the partial address PADD_0 based on the input address bits ADD<5:0>.

In FIG. 3B, each of the partial addresses PADD_0 to PADD_2 have a length of six bits, and the partial address PADD_3 has a length of two bits. That is, in some examples the length of at least one partial address PADD_3 among the plurality of partial addresses may be set to a different value than the lengths of the other partial addresses PADD_0 to PADD_2.

Next, referring to FIGS. 4 and 5, the partial address counter 120 will be described.

FIG. 4 is a configuration diagram of a partial address counter 120.

Referring to FIG. 4, the partial address counter 120 includes a storage circuit 121, a selection circuit 122, an increase circuit 123, and an update circuit 124.

The storage circuit 121 includes storage places corresponding to a plurality of values to which the partial address PADD can be set.

Figure 5:
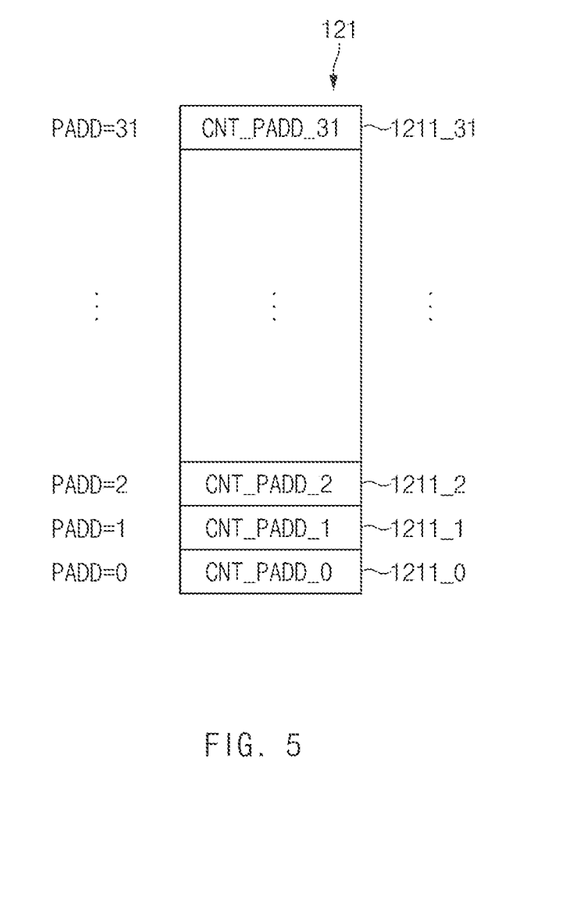
FIG. 5 is a diagram illustrating an example of a storage circuit.

FIG. 5 is an example of the storage circuit 121. FIG. 5 is an example in which the partial address PADD has five bits. Therefore, the partial address PADD may have a value ranging from "00000" to "11111", that is, 0 to 31.

Referring to FIG. 5, the storage circuit 121 includes a plurality of storage places 1211_0 to 1211_31 corresponding to the plurality of values to which the partial address PADD can be set, that is, 0 to 31. The plurality of storage places 1211_0 to 1211_31 may be represented by 1211. Each of the storage places 1211_0 to 1211_31 may include a latch.

The storage places 1211_0 to 1211_31 store the input counts CNT_PADD_0 to CNT_PADD_31 of a plurality of values which may be set to the corresponding partial address. The input counts CNT_PADD_0 to CNT_PADD_31 may be represented by CNT_PADD. That is, the input count CNT_PADD_0 for the partial address value of 0 may be stored in the storage place 1211_0, the input count CNT_PADD_1 for the partial address value of 1 may be stored in the storage place 1211_1, the input count CNT_PADD_2 for the partial address value of 2 may be stored in the storage place 1211_2, etc. The input counts CNT_PADD_0 to CNT_PADD_31 of the partial address values which may be stored in the respective storage places 1211_0 to 1211_31, may be provided to the selection circuit 122.

In the present embodiment, the storage circuit 121 includes 32 storage places 1211_0 to 1211_31 because the partial address PADD has a length of five bits. However, the present embodiment is not limited thereto. When the partial address has m bits, where m is a natural number greater than or equal to 1, the storage circuit 121 may include $2^m$ storage places 1211.

Alternatively, the storage circuit 121 may include only storage places corresponding to values which are frequently used, but may exclude some of the values which are infrequently used. The frequently used values may be set as a partial address PADD. For example, a certain memory cell may not be used or may be used at a low frequency. In this case, the partial address values of the address ADD indicating the memory cell may be excluded from being stored in the storage circuit 121.

Referring back to FIG. 4, the storage circuit 121 may communicate the plurality of input counts CNT_PADD_0 to CNT_PADD_31 as the CNT_PADD to the selection circuit 122. The selection circuit 122 selects an input count CNT_PADD corresponding to an input partial address value from among the input counts CNT_PADD_0 to CNT_PADD_31 of the respective partial address values. For example, if an input partial address value input to the selection circuit 122 is 14, the selection circuit 122 selects the input count CNT_PADD_14 forwarded from the storage circuit 121 in the input count CNT_PADD.

FIG. 4 illustrates that the input counts CNT_PADD of the respective partial address values provided from the storage circuit 121, have the same symbol as the input count CNT_PADD of the partial address value selected by the selection circuit 122. However, the input counts CNT_PADD of the respective partial address values provided from the storage circuit 121, indicate the plurality of input counts CNT_PADD corresponding to the plurality of partial address values which can be set to the partial address. The plurality of input counts CNT_PADD may correspond to CNT_PADD_0 to CNT_PADD_31 of FIG. 5. On the other hand, the input count CNT_PADD of the partial address value selected by the selection circuit 122, indicates one input count selected among the plurality of input counts CNT_PADD provided from the storage circuit 121.

The increase circuit 123 may generate the updated input count UPDATE_CNT_PADD by increasing the value of the selected input count CNT_PADD by 1. The generated updated input count UPDATE_CNT_PADD may be provided to the target refresh address generation circuit 200 and the update circuit 124.

The update circuit 124 updates the input count CNT_PADD of the partial address value of the partial address PADD stored in the storage circuit 121, using the updated input count UPDATE_CNT_PADD. That is, the update circuit 124 provides the updated input count UPDATE_CNT_PADD as an input count CNT_PADD to the storage place corresponding to the partial address value.

For example, when the partial address value of the partial address PADD is 14, the update circuit 124 may update the input count CNT_PADD_14 stored in the storage place 1211_14 corresponding to the partial address value of 14 into the updated input count UPDATE_CNT_PADD having a value larger by 1 than the input count CNT_PADD_14.

Then, when the partial address PADD is inputted, the storage circuit 121 provides the input counts CNT_PADD_0 to CNT_PADD_31 stored in the respective storage places 1211_0 to 1211_31 to the selection circuit 122.

The input counts CNT_PADD_0 to CNT_PADD_31 stored in the storage circuit 121 may have an initial value of 0.

Referring back to FIG. 2, the address processing circuit 100 includes a plurality of partial address counters 120_0 to 120_k-1 corresponding to the number of the partial addresses PADD_0 to PADD_k-1, the partial address counters 120_0 to 120_k-1 being represented by 120 in FIG. 4. The partial address counters 120_0 to 120_k-1 increase the input counts CNT_PADD by 1, the input counts CNT_PADD corresponding to the value of the input partial addresses PADD_0 to PADD_k-1 of the storage circuits 121 included in the respective partial address counters 120_0 to 120_k-1. The partial address counters 120_0 to 120_k-1 output the increased input counts as the updated input counts UPDATE_CNT_PADD_0 to UPDATE_CNT_PADD_k-1, respectively.

Figure 6:
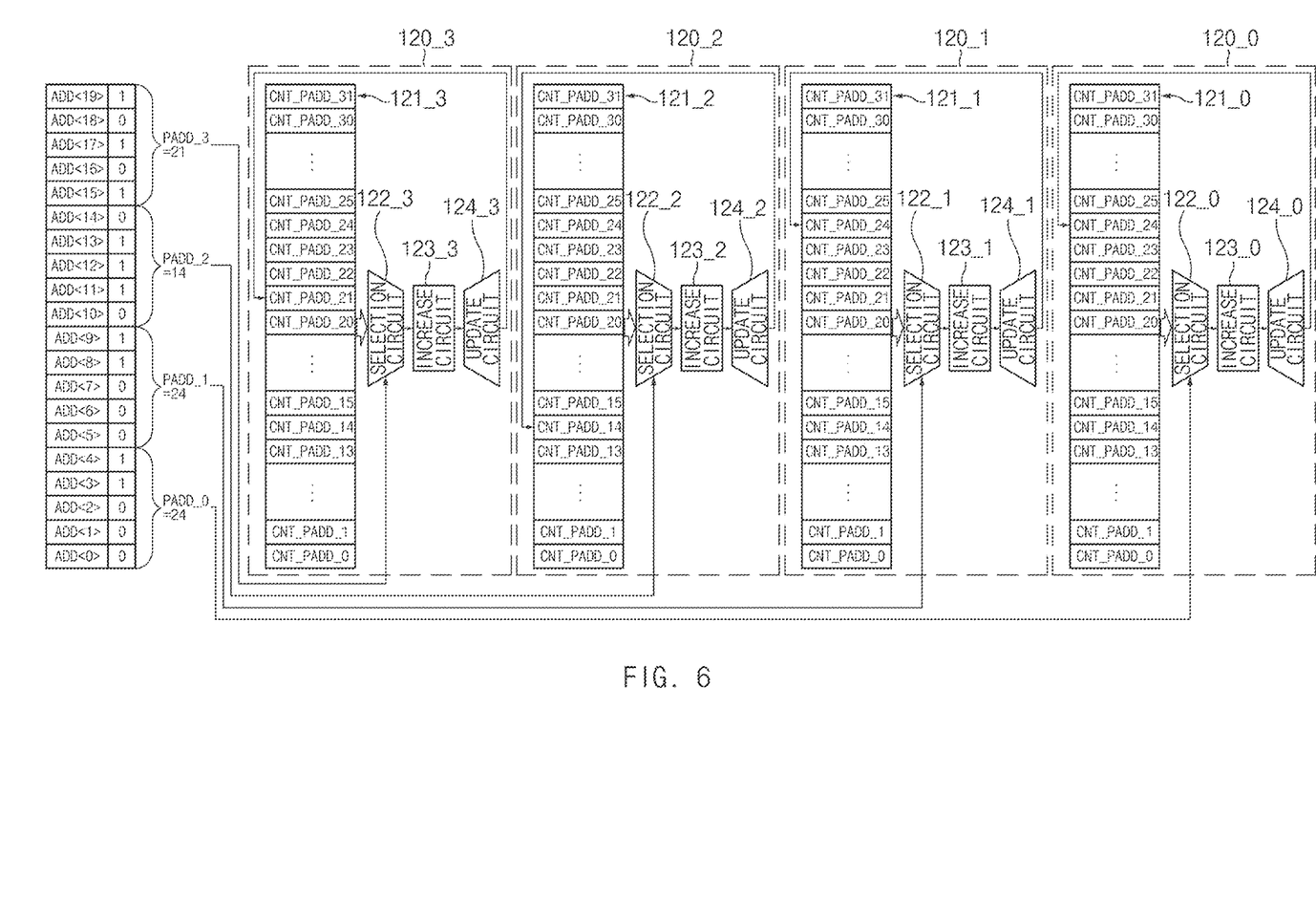
FIG. 6 is a diagram for describing an operation of the address processing circuit.

FIG. 6 is a diagram for describing the values of signals of the address processing circuit 100 when the input address ADD has a specific value. FIG. 6 is based on an example in which the input address ADD<19:0> is "10101 01110 11000 11000" and the address divider 110 divides the input address ADD<19:0> into four partial addresses PADD_0 to PADD_3 each having five bits, as illustrated in FIG. 3A.

Referring to FIG. 6, the address divider 110 generates the partial addresses PADD_0 to PADD_3 by dividing the input address ADD into four parts. The partial address PADD_0 has a value of "11000 (or 24)", the partial address PADD_1 has a value of "11000 (or 24)", the partial address PADD_2 has a value of "01110 (or 14)", and the partial address PADD_3 has a value of "10101 (or 21)".

The partial addresses PADD_0 to PADD_3 are inputted to the respective partial address counters 120_0 to 120_3. As illustrated in FIG. 6, the partial address counters 120_0 to 120_3 include storage circuits 121_0 to 121_3, selection circuits 122_0 to 122_3, increase circuits 123_0 to 123_3, and update circuits 124_0 to 124_3, respectively.

The partial address counters 120_0 to 120_3 increase the input counts CNT_PADD corresponding to the input partial addresses PADD_0 to PADD_3, among the plurality of input counts CNT_PADD_0 to CNT_PADD_31 provided from the storage circuits 121_0 to 121_3.

For example, the selection circuit 122_0 of the partial address counter 120_0 selects the input count CNT_PADD_24 corresponding to the value (24) of the partial address PADD_0 provided from the storage circuit 121_0. The selection circuit 122_0 may provide the partial address input count CNT_PADD_24 to the increase circuit 123_0. The increase circuit 123_0 increases the value of the input count CNT_PADD_24 by 1 and outputs the increased input count as the updated input count UPDATE_CNT_PADD_0. The update circuit 124_0 updates the input count CNT_PADD_24 corresponding to the value of the input partial address PADD_0 and outputs the updated input count UPDATE_CNT_PADD_0.

Similarly, the selection circuit 122_1 of the partial address counter 120_1 selects the partial address input count CNT_PADD_24 corresponding to the value (24) of the partial address PADD_1 provided from the storage circuit 121_1. The selection circuit 122_1 may provide the partial address input count CNT_PADD_24 to the increase circuit 123_1. The increase circuit 123_1 increases the input count CNT_PADD_24 by 1 and outputs the increased input count as the updated input count UPDATE_CNT_PADD_1. The update circuit 124_1 updates the input count CNT_PADD_24 corresponding to the value of the input partial address PADD_1 and outputs the updated input count UPDATE_CNT_PADD_1.

The partial address counters 120_2 and 120_3 perform the same operation to output the updated input counts UPDATE_CNT_PADD_2 and UPDATE_CNT_PADD_3, and update the input counts CNT_PADD_14 and CNT_PADD_21 corresponding to the values of the input partial addresses PADD_2 and PADD_3 and outputs the updated input counts UPDATE_CNT_PADD_2 and UPDATE_CNT_PADD_3.

In FIG. 6, the input counts CNT_PADD_0 to CNT_PADD_31 for the partial address values, stored in each of the storage circuits 121_0 to 121_3, are represented by the same reference numerals. However, the storage circuits 121_0 to 121_3 store the input counts based on the values of the respective partial addresses PADD_0 to PADD_3. That is, the storage circuit 121_0 stores the input counts for the respective values (0 to 31) of the partial address PADD_0, the storage circuit 121_1 stores the input counts for the respective values (0 to 31) of the partial address PADD_1, the storage circuit 121_2 stores the input counts for the respective values (0 to 31) of the partial address PADD_2, and the storage circuit 121_3 stores the input counts for the respective values (0 to 31) of the partial address PADD_3. In other words, the input counts for the respective values of different partial addresses PADD_0 to PADD_3 are stored in the storage circuits 121_0 to 121_3. Therefore, the input counts CNT_PADD_0 to CNT_PADD_31 provided from the storage circuit 121_0, the input counts CNT_PADD_0 to CNT_PADD_31 provided from the storage circuit 121_1, the input counts CNT_PADD_0 to CNT_PADD_31 provided from the storage circuit 121_2, and the input counts CNT_PADD_0 to CNT_PADD_31 provided from the storage circuit 121_3 may be different from one another. In FIG. 6, the input count CNT_PADD_24 for the value (24) of the partial address PADD_0, stored in the storage circuit 121_0, may be different from the input count CNT_PADD_24 for the value (24) of the partial address PADD_1, stored in the storage circuit 121_1.

Figure 7:
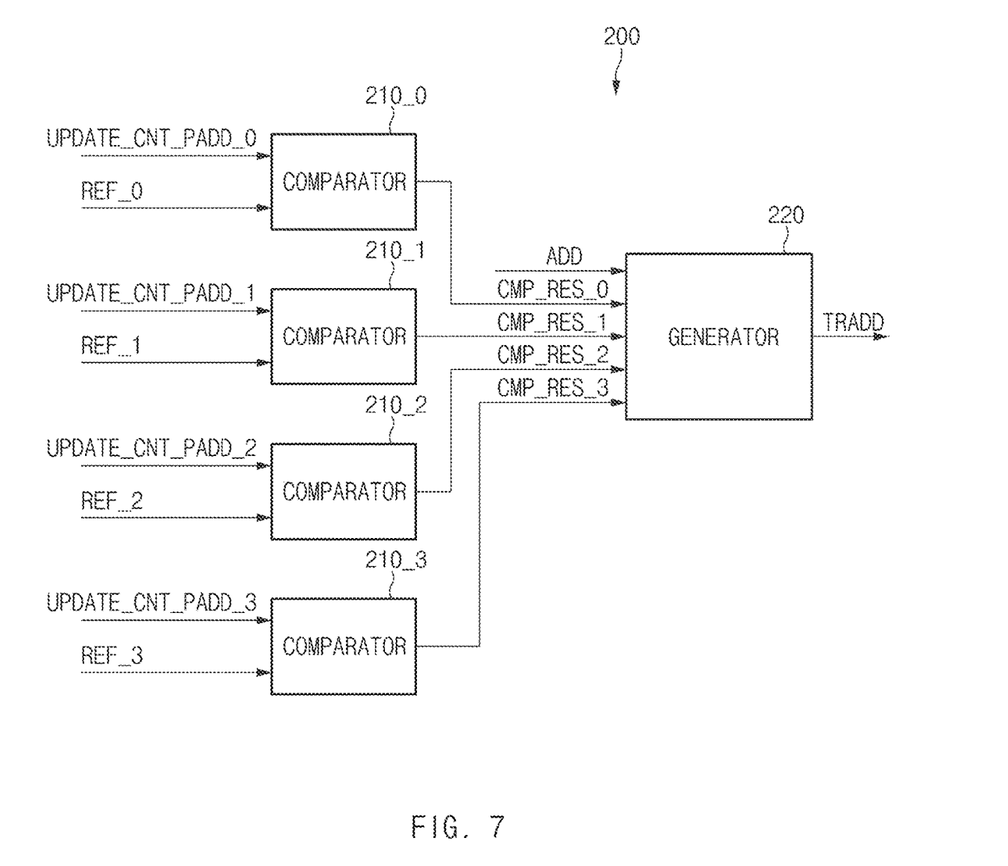
FIG. 7 is a configuration diagram of a target refresh address generation circuit.

FIG. 7 is a configuration diagram of the target refresh address generation circuit 200.

Referring to FIG. 7, the target refresh address generation circuit 200 includes k comparators or in this example comparators 210_0 to 210_3 and a generator 220. The comparators 210_0 to 210_3 may be represented by 210. The k comparators, 210_0 to 210_3 for example, may correspond to the k updated input counts, UPDATE_CNT_PADD_0 to UPDATE_CNT_PADD3 for example, outputted from the k partial address counters, partial address counters 120_0 to 120_3 for example. The target refresh address generation circuit 200 generates a target refresh address TRADD based on the updated input counts UPDATE_CNT_ PADD.

For example, the comparator 210_0 determines whether the updated input count UPDATE_CNT_PADD_0 is larger than a reference value REF_0, and generates and/or enables a comparison result signal CMP_RES_0 if the updated input count UPDATE_CNT_PADD_0 is larger than the reference value REF_0. Similarly, the comparator 210_1 determines whether the updated input count UPDATE_CNT_PADD_1 is larger than a reference value REF_1, and generates and/or enables a comparison result signal CMP_RES_1 if the updated input count UPDATE_CNT_PADD_1 is larger than the reference value REF_1. The comparator 210_2 determines whether the updated input count UPDATE_CNT_PADD_2 is larger than a reference value REF_2, and generates and/or enables a comparison result signal CMP_RES_2 if the updated input count UPDATE_CNT_PADD_2 is larger than the reference value REF_2. Also, the comparator 210_3 determines whether the updated input count UPDATE_CNT_PADD_3 is larger than a reference value REF_3 and generates and/or enables a comparison result signal CMP_RES_3 if the updated input count UPDATE_CNT_PADD_3 is larger than the reference value REF_3.

The reference values REF_0 to REF_3 are preset values. When the lengths of the partial addresses PADD_0 to PADD_3 are equal to each other as illustrated in FIG. 3A, the reference values REF_0 to REF_3 may be set to the same value. On the other hand, when the length of the partial address PADD_3 is different from the length of the other addresses PADD_0 to PADD_2 as illustrated in FIG. 3B, the partial address PADD_3 may be set to a different value than the other addresses PADD_0 to PADD_2. At this time, because the length of the partial address PADD_3 is smaller than the length of the partial addresses PADD_0 to PADD_2 in FIG. 3B, the reference value REF_3 may be set to a smaller value than the reference values REF_0 to REF_2. That is, the reference values REF_0 to REF_3 may be set based on the lengths of the corresponding partial addresses PADD_0 to PADD_3.

The generator 220 generates the target refresh address TRADD based on the comparison result signals CMP_RES_0 to CMP_RES_3 generated by the comparators 210_0 to 210_3. Also, the generator 220 may generate the target refresh address TRADD based on the input address ADD, if the comparison result signals CMP_RES_0 to CMP_RES_3 generated by the comparators 210_0 to 210_3 are all enabled. As described above, row hammering may cause data loss in memory cells coupled to a word line near a word line which is frequently accessed. Thus, the target refresh address TRADD may indicate a word line adjacent to the word line indicated by the input address ADD. For example, the target refresh address TRADD may be set to a value obtained by increasing or decreasing the value of the input address ADD by 1.

Referring back to FIG. 1, the target refresh circuit 300 performs a target refresh operation on, for example, a word line corresponding to the target refresh address TRADD. Furthermore, the normal refresh circuit 400 sequentially performs normal refresh operations on a plurality of word lines in a semiconductor device (not illustrated) including the refresh control device 10 at a predetermined cycle. At this time, the target refresh circuit 300 may perform an additional refresh operation on the target refresh address TRADD.

Figure 8:
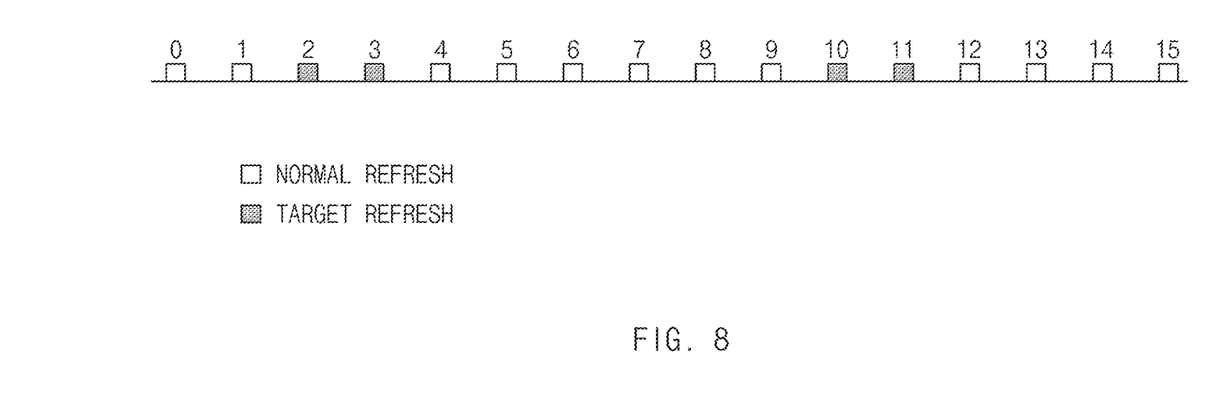
FIG. 8 is a timing diagram for describing a target refresh operation and a normal refresh operation.

FIG. 8 is a timing diagram for describing a target refresh operation and a normal refresh operation. In FIG. 8, a number indicates a turn of a section at which the target refresh operation or normal refresh operation is performed.

Referring to FIG. 8, the normal refresh operation is sequentially performed on the plurality of word lines at sections 0, 1, 4 to 9 and 12 to 15. That is, the normal refresh operation is sequentially performed on a plurality of word lines at section 0, and the normal refresh operation is sequentially performed on the plurality of word lines at the section 1.

Figure 9:
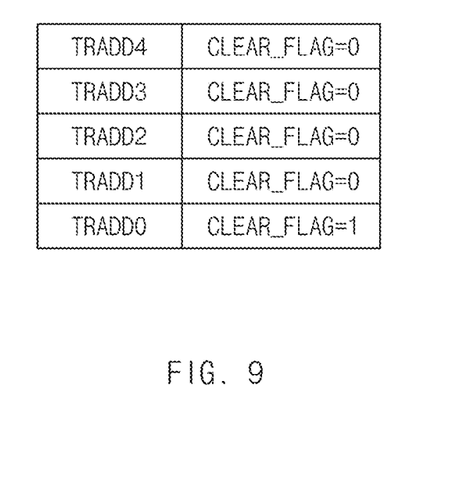
FIG. 9 is a diagram illustrating an example of a target refresh address table included in a target refresh circuit.

At the sections 2, 3, 10 and 11, the target refresh operation is performed on the target refresh address TRADD. That is, in FIG. 8, two target refresh operations are performed after six normal refresh operations are performed. FIG. 9 is an example of a target refresh address table included in the target refresh circuit 300.

Referring to FIG. 9, the target refresh address table stores pairs of a target refresh address TRADD and a refresh clear signal CLEAR_FLAG. The target refresh addresses TRADD generated by the target refresh address generation circuit 200 are sequentially stored in the target refresh address table. When a target refresh address TRADD is stored, the corresponding refresh clear signal CLEAR_FLAG has a disabled value (for example, 0). In one particular example, when the target refresh address TRADD is inputted from the target refresh address generation circuit 200, target refresh circuit 300 may store the target refresh address TRADD and the corresponding refresh clear signal CLEAR_FLAG in the table, and disable the refresh clear signal CLEAR_FLAG.

In order to perform the target refresh operation at a specific time as illustrated in FIG. 8, the target refresh circuit 300 may store a target refresh address TRADD in the target refresh address table, and performs the target refresh operation on the target refresh address TRADD at the preset time.

In FIG. 8, the target refresh circuit 300 performs two target refresh operations on the target refresh address TRADD whenever six normal refresh operations are performed. That is, the target refresh circuit 300 may control the timing of the target refresh operation using the target refresh address table. [0077] The target refresh circuit 300 performs the target refresh operation only on a target refresh address TRADD when the refresh clear signal CLEAR_FLAG is disabled. For a target refresh address TRADD located at an address where the target refresh operation is done, the target refresh circuit 300 enables the corresponding refresh clear signal CLEAR_FLAG. Thus, the target refresh circuit 300 may, for example, not perform a subsequent refresh operation on the target refresh address TRADD corresponding to the enabled refresh clear signal CLEAR_FLAG.

The above-described target refresh operation may increase the cycle of the normal refresh operation. In FIG. 8, 12 normal refresh operations are performed during a total of 16 periods (T). Thus, the period of a normal refresh operation may be considered as approximately 1.33 T. On the other hand, only when a normal refresh operation is performed at all of the sections 0 to 15 a cycle time of the normal refresh operation may correspond to T. Therefore, when a target refresh operation is performed, the cycle time of a normal refresh operation may be increased.

Thus, a proper refresh operation may possibly not be performed on a word line. In this case, data stored in memory cells coupled to the word line is likely to be lost. The target refresh circuit 300 may generate a temperature offset signal TEMP_OFFSET in order to compensate for the increase in cycle time of the normal refresh operation.

Figure 10:
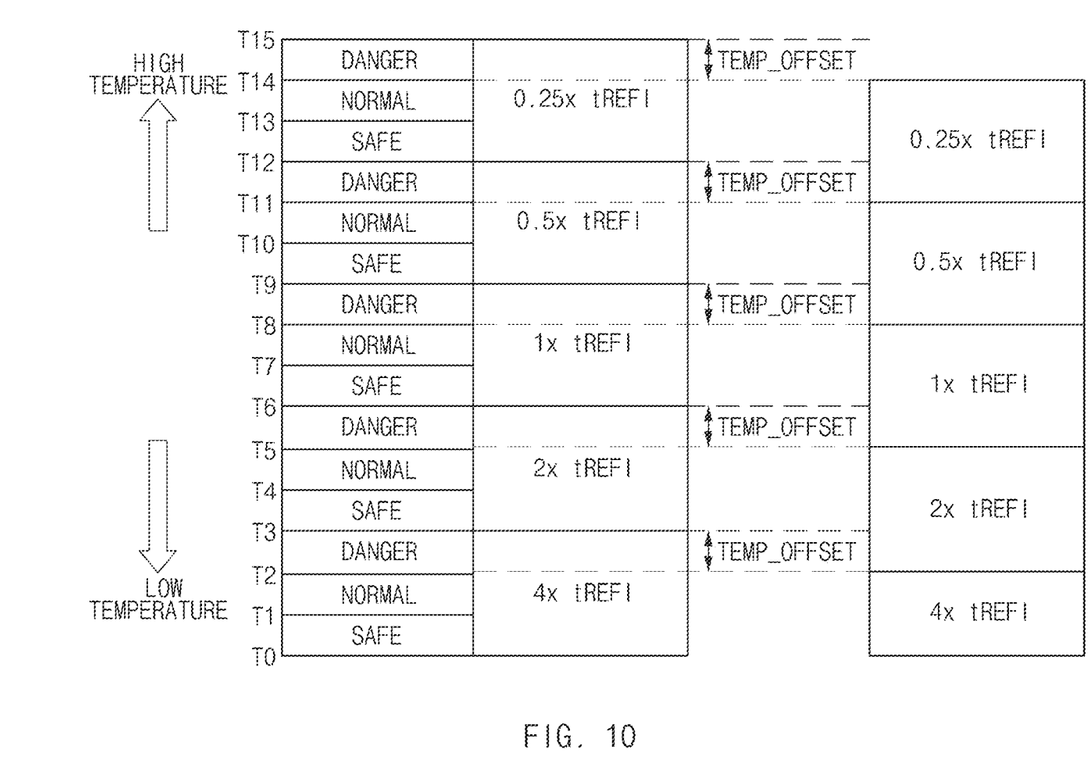
FIG. 10 is a diagram illustrating an example of a refresh cycle table included in a normal refresh circuit.

FIG. 10 is an example of a refresh cycle table included in the normal refresh circuit 400.

Referring to FIG. 10, the rise of temperature may increase the possibility that charges stored in memory cells would be lost. Therefore, the normal refresh circuit 400 may divide the temperature into a plurality of sections, and set different cycle times to the respective sections.

In the refresh cycle table of FIG. 10, the cycle time of the normal refresh operation is set in such a manner that a normal refresh operation is performed at each quadruple of a basic cycle tREFI at a section T0~T3 when the temperature is the lowest, a normal refresh operation is performed at each double of the basic cycle tREFI at the section T3~T6 when the temperature is the second lowest, a normal refresh operation is performed at each basic cycle tREFI at a section T6~T9 when the temperature is the third lowest, a normal refresh operation is performed at each half of the basic cycle tREFI or two normal refresh operations are performed at each basic cycle tREFI at a section T9~T12 when the temperature is the fourth lowest, and a normal refresh operation is performed at each quarter of the basic cycle tREFI or four normal refresh operations are performed at each basic cycle tREFI at a section T12~T15 when the temperature is the highest. At this time, when the target refresh circuit 300 performs the target refresh operation to increase the cycle time of the normal refresh operation, the data loss risk may increase at the temperature sections T2~T3, T5~T6, T8~T9, T11~T12, and T14~T15 when the temperature is high, among the temperature sections of the refresh cycle table.

In the present embodiment, the target refresh circuit 300 provides the temperature offset signal TEMP_OFFSET to the normal refresh circuit 400. The normal refresh circuit 400 may adjust the temperature sections of the refresh cycle table, based on the temperature offset signal TEMP_OFFSET.

As illustrated in FIG. 10, the normal refresh circuit 400 may adjust the temperature sections T0~T3, T3~T6, T6~T9, T9~T12, and T12~T15 when the cycle of the normal refresh operation is set differently. For example, the normal refresh circuit 400 may reduce boundary values of the temperature sections T0~T3, T3~T6, T6~T9, T9~T12 and T12~T15 by the value of the temperature offset signal TEMP_OFFSET, and adjust the temperature sections into temperature sections T0~T2, T2~T5, T5~T8, T8~T11, and T11~T14. In other words, the normal refresh circuit 400 adjusts the temperature sections of the refresh cycle table such that a normal refresh operation is performed at each quadruple of the basic cycle tREFI at the temperature section T0~T2, a normal refresh operation is performed at each double of the basic cycle tREFI at the temperature section T2~T5, a normal refresh operation is performed at each basic cycle tREFI at the temperature section T5~T8, a normal refresh operation is performed at each half of the basic cycle tREFI or two normal refresh operations are performed at each basic cycle tREFI at the temperature section T8~T11, and a normal refresh operation is performed at each quarter of the basic cycle tREFI or four normal refresh operations are performed at each basic cycle tREFI at the temperature section T11~T14.

Thus, since the normal refresh cycles are increased for the high temperature sections T2~T3, T5~T6, T8~T9, T11~T12 and T14~T15 among the temperature sections before the normal refresh cycles are adjusted, the data loss risk can be reduced.

Figure 11:
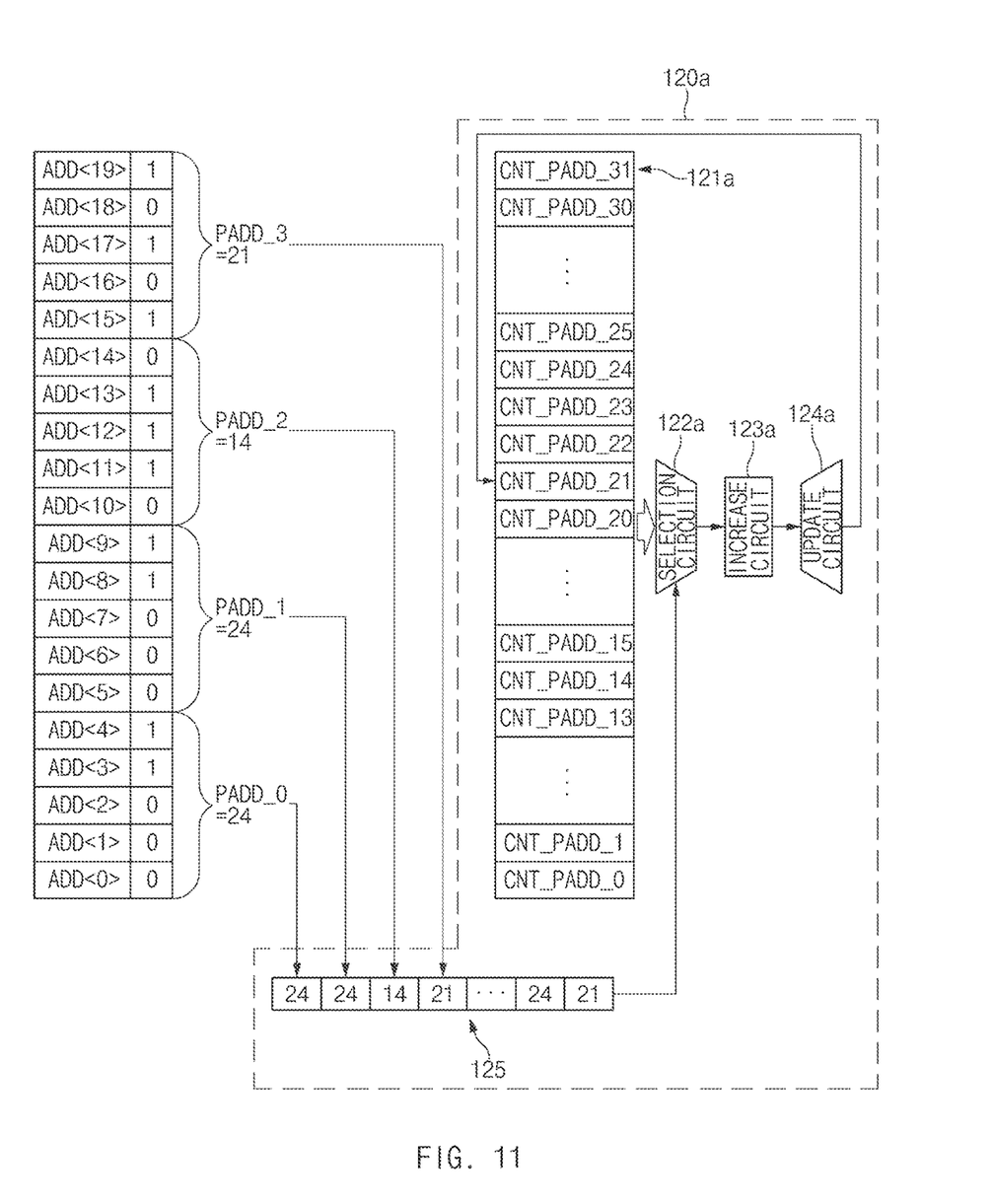
FIG. 11 is a diagram for describing an operation of an address processing circuit including a partial address counter according to a modification.

FIG. 11 is a diagram for describing the values of signals of an address processing circuit 100 including a partial address counter 120a according to another embodiment.

Referring to FIG. 11, the partial address counter 120a includes a storage circuit 121a, a selection circuit 122a, an increase circuit 123a, an update circuit 124a, and a partial address value storage circuit 125.

The embodiments of FIGS. 2 and 6 include the plurality of partial address counters 120_0 to 120_3, and the partial addresses PADD_0 to PADD_3 are inputted to the respective partial address counters 120_0 to 120_3. The descriptions of elements disclosed in the embodiments of FIGS. 1 to 6 apply to the embodiment of FIG. 11. In the embodiment of FIG. 11, however, the plurality of partial addresses PADD_0 to PADD_3 are all inputted to one partial address counter 120a.

The partial address values of the input partial addresses PADD_0 to PADD_3 are stored in the partial address value storage circuit 125.

The storage circuit 121a stores the input counts for the respective partial address values of the partial addresses PADD_0 to PADD_3. In the embodiments of FIGS. 2 and 6, different storage circuits 121_0 to 121_3 are installed for the respective partial address PADD_0 to PADD_3. In the present embodiment, however, the input counts for the respective values of the partial addresses PADD_0 to PADD_3 are all stored in the storage circuit 121a.

The selection circuit 122a sequentially selects the input counts corresponding to the respective values of the partial addresses PADD_0 to PADD_3, stored in the partial address value storage circuit 125. Accordingly, in one example, the partial address counter 120a may generate updated partial address input counts corresponding to the partial addresses PADD_0 to PADD_3 based on input counts for the partial address values stored in the partial address value storage circuit 125.

Because the operations of the increase circuit 123a and the update circuit 124a are performed in a substantially similar as the increase circuit 123 and the update circuit 124 of FIGS. 4 and 6, the detailed descriptions thereof are omitted herein.

According to the present modification, it is possible to reduce the number of storage circuits 121a for storing the input counts for the respective partial address values of the partial addresses.

According to the present embodiments, the refresh control device may divide an input address into a plurality of partial addresses, and calculate input counts for partial address values. Thus, the refresh control device may include storage places corresponding to the respective partial address values in order to store the input counts. On the contrary, when input counts for the overall values of the input address are calculated, a number of storage places corresponding to the respective input address values must be installed. The number of values which can be set to each of the partial addresses is smaller than the number of values which can be set to the input address. Therefore, the refresh control device can reduce the number of storage places when the input counts for the address values are calculated.

While certain embodiments have been described above, it will be understood to those skilled in the art that the embodiments described are by way of example only. Accordingly, the refresh control device described herein should not be limited based on the described embodiments. Rather, the refresh control device described herein should only be limited in light of the claims that follow when taken in conjunction with the above description and accompanying drawings.

What is claimed is:

1. A refresh control device comprising:
   an address processing circuit configured to divide an input address into a plurality of partial addresses, and generate an updated partial address input count based on an input count for each partial address value;
   a target refresh address generation circuit configured to generate a target refresh address based on the updated partial address input count; and
   a target refresh circuit configured to perform a refresh operation on a word line corresponding to the target refresh address.

2. The refresh control device of claim 1, wherein the address processing circuit comprises:
   an address divider configured to divide the input address into k partial addresses where k is a natural number equal to or more than 2; and
   k partial address counters corresponding to the respective partial addresses,
   wherein each of the partial address counters generates the updated partial address input count based on the input count for the corresponding partial address value.

3. The refresh control device of claim 2, wherein each of the partial address counters comprises:
   a storage circuit configured to store input counts for a plurality of values which can be set to the corresponding partial address;
   a selection circuit configured to select the input count for the corresponding partial address value among the input counts for the plurality of values which are stored in the storage circuit; and
   an increase circuit configured to generate the updated partial address input count by increasing the selected input count; and
   an update circuit configured to update the input count into the updated partial address input count, the input count corresponding to the partial address value among the input counts for the plurality of values which are stored in the storage circuit.

4. The refresh control device of claim 3, wherein the storage circuit comprises a set of $2^m$ storage places, when the corresponding partial address has a length of m bits where m is a natural equal to or more than 1.

5. The refresh control device of claim 2, wherein the target refresh address generation circuit comprises:
   k comparators corresponding to the k updated partial address input counts outputted from the k partial address counters, and configured to generate comparison result signals by comparing the updated partial address input counts to reference values, respectively; and
   a generator configured to generate the target refresh address based on the comparison result signals generated by the k comparators.

6. The refresh control device of claim 5, wherein the reference values inputted to the respective k comparators are set based on the lengths of the corresponding partial addresses.

7. The refresh control device of claim 5, wherein the k partial addresses have the same length, and
   the reference values inputted to the respective k comparators are equal to each other.

8. The refresh control device of claim 5, wherein one or more of the k partial addresses have a different length from the other partial addresses, and
   the reference values inputted to the respective k comparators are different from each other.

9. The refresh control device of claim 5, wherein each of the k comparators enables the comparison result signal when the corresponding updated partial address input count is larger than the corresponding reference value.

10. The refresh control device of claim 9, wherein when the comparison result signals generated by the k comparators are all enabled, the generator generates the target refresh address based on the input address.

11. The refresh control device of claim 1, wherein the target refresh circuit comprises a table for storing a pair of the target refresh address and a refresh clear signal.

12. The refresh control device of claim 11, wherein when the target refresh address is inputted from the target refresh address generation circuit, the target refresh circuit stores the target refresh address and the corresponding refresh clear signal in the table, and disables the refresh clear signal.

13. The refresh control device of claim 12, wherein the target refresh circuit performs a refresh operation on a word line corresponding to the target refresh address paired with the disabled refresh clear signal, and enables the refresh clear signal corresponding to the target refresh address at which the refresh operation was performed.

14. The refresh control device of claim 1, further comprising a normal refresh circuit configured to sequentially perform a refresh operation on a plurality of word lines at a predetermined cycle,
   wherein the target refresh circuit generates a temperature offset signal, and
   the normal refresh circuit adjusts the cycle of the refresh operation on the plurality of word lines, based on the temperature offset signal.

15. The refresh control device of claim 14, wherein the normal refresh circuit comprises a temperature table in which the predetermined cycle is set to different values for temperature sections, and adjusts the temperature sections based on the temperature offset signal.

16. The refresh control device of claim 1, wherein the address processing circuit comprises:
   an address divider configured to divide the input address into k partial addresses where k is a natural number equal to or more than 2;
   a partial address value storage circuit configured to store the values of the k partial addresses; and
   a partial address counter configured to generate k updated partial address input counts corresponding to the k partial addresses, based on input counts for the partial address values stored in the partial address value storage circuit.

17. The refresh control device of claim 16, wherein the partial address counter comprises:
- a storage circuit configured to store input counts for a plurality of values which can be set to the partial addresses;
- a selection circuit configured to select an input count corresponding to a partial address value stored in the partial address value storage circuit, among the input counts for the plurality of values which are stored in the storage circuit;
- an increase circuit configured to generate an updated partial address input count by increasing the selected input count; and
- an update circuit configured to update the selected input count, among the input counts for the plurality of values which are stored in the storage circuit, into the updated partial address input count.

* * * * *